(12) United States Patent
Won et al.

(10) Patent No.: US 10,547,307 B2
(45) Date of Patent: Jan. 28, 2020

(54) BIAS CIRCUIT AND POWER AMPLIFIER HAVING THE SAME

(71) Applicant: Samsung Electro-Mechanics Co., Ltd., Suwon-si (KR)

(72) Inventors: Jun Goo Won, Suwon-si (KR); Youn Suk Kim, Suwon-si (KR); Yoshiyuki Tonami, Suwon-si (KR); Ki Joong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/009,382

(22) Filed: Jun. 15, 2018

(65) Prior Publication Data

US 2018/0294809 A1 Oct. 11, 2018

Related U.S. Application Data

(63) Continuation of application No. 14/886,804, filed on Oct. 19, 2015, now Pat. No. 10,027,320.

(30) Foreign Application Priority Data

Nov. 10, 2014 (KR) .......................... 10-2014-0155374

(51) Int. Cl.
*H03F 3/04* (2006.01)
*H03K 17/60* (2006.01)
(Continued)

(52) U.S. Cl.
CPC ........... *H03K 17/60* (2013.01); *H03F 1/0266* (2013.01); *H03F 3/19* (2013.01); *H03F 3/245* (2013.01);
(Continued)

(58) Field of Classification Search
CPC ......... H03K 17/60; H03F 3/19; H03F 1/0266; H03F 3/245; H03F 1/301; H03F 1/302; H03F 2200/18; H03F 2200/21
(Continued)

(56) References Cited

U.S. PATENT DOCUMENTS 6,753,734 B2   6/2004   Arell et al.
6,803,822 B2   10/2004  Kim et al.
(Continued)

FOREIGN PATENT DOCUMENTS

KR   10-2005-0017617 A   2/2005
KR   10-2013-0133528 A   12/2013

OTHER PUBLICATIONS

Korean Office Action dated Dece. 20, 2018 in corresponding Korean Patent Application No. 10-2014-0155374 (6 pages in English, 5 pages in Korean).

*Primary Examiner* — Khanh V Nguyen
(74) *Attorney, Agent, or Firm* — NSIP Law

(57) ABSTRACT

A bias circuit providing different bias voltages depending on a power mode through a simple circuit, and a power amplifier having the same are provided. The bias circuit and the power amplifier include a bias setting unit configured to vary a voltage level of a control signal controlling a bias voltage according to an operation of a first transistor being switched-off in a high power mode and switched-on in a low power mode. A bias supplying unit includes a bias supplying transistor switched based on the control signal, to supply the bias voltage having a voltage level according to a switching operation of the bias supplying transistor.

14 Claims, 4 Drawing Sheets

(51) Int. Cl.
  *H03F 1/02* (2006.01)
  *H03F 3/19* (2006.01)
  *H03F 3/24* (2006.01)
  *H03F 1/30* (2006.01)

(52) U.S. Cl.
  CPC .............. *H03F 1/301* (2013.01); *H03F 1/302* (2013.01); *H03F 2200/18* (2013.01); *H03F 2200/21* (2013.01)

(58) Field of Classification Search
  USPC .................................................. 330/285, 296
  See application file for complete search history.

(56) References Cited

U.S. PATENT DOCUMENTS

| | | | | |
|---|---|---|---|---|
| 6,946,911 B2* | 9/2005 | Yang | ........................ | H03F 1/302 330/285 |
| 7,057,462 B2* | 6/2006 | Kang | ........................ | H03F 1/30 330/285 |
| 7,129,786 B2* | 10/2006 | Kim | ........................ | H03F 1/025 330/297 |
| 7,372,332 B2* | 5/2008 | Birkbeck | ................. | H03C 1/36 330/296 |
| 7,504,887 B2* | 3/2009 | Masuda | .................... | H03F 1/30 330/289 |
| 7,602,238 B2 | 10/2009 | Matsuzuka et al. | | |
| 7,639,080 B2* | 12/2009 | Nakayama | .............. | H03F 3/189 330/133 |
| 8,040,186 B2 | 10/2011 | Nakayama et al. | | |
| 8,854,142 B2 | 10/2014 | Iizuka et al. | | |
| 8,981,849 B2 | 3/2015 | Song | | |
| 2005/0024148 A1 | 2/2005 | Kim et al. | | |
| 2013/0321086 A1 | 12/2013 | Iizuka et al. | | |

* cited by examiner

BIAS CIRCUIT AND POWER AMPLIFIER HAVING THE SAME

CROSS-REFERENCE TO RELATED APPLICATION

This application is a continuation of U.S. application Ser. No. 14/886,804 filed on Oct. 19, 2015 which claims the priority and benefit under 35 USC 119(a) of Korean Patent Application No. 10-2014-0155374 filed on Nov. 10, 2014, in the Korean Intellectual Property Office, the entire disclosure of which is incorporated herein by reference.

BACKGROUND

1. Field

The following description relates to a bias circuit providing different bias voltages depending on a power mode, and a power amplifier having the same.

2. Description of Related Art

In general, a main purpose of a power amplifier is to supply power to a load. The power amplifier is generally referred to as a last stage amplifier because it is generally positioned in a final stage of amplifying circuits.

It is important for the power amplifier to have a small degree of distortion and to efficiently supply the power to the load. Therefore, typically, a power transistor is used as an amplifying element of the power amplifier.

In light of the explosive growth of wireless communications technology, a large number of people are enabled to wirelessly transmit and receive information through portable devices, such as mobile devices, regardless of time and place. However, because the use of wireless communications by such large number of people has increased, various services have been required. To satisfy user demand for such services, portable terminals have been provided with increased functionality, causing a problem in that an amount of time that the portable terminals may continuously operate has significantly reduced.

The reduction in continuous operation of the portable terminals and, therefore, a reduction of maximum talk time for a user of the portable terminal are mainly caused by device power consumption and are caused because battery capacity of the portable terminal is limited. In a case in which battery capacity is increased, a volume of the portable terminal increases leading to user-desired thinness and lightness not to being satisfied. As a result, there is a need for efficient power usage.

The power amplifier described above may also be adopted for use in a portable terminal to be utilized for wireless communications, and may be used to amplify a level of a transmitted or received signal. Therefore, in order to realize efficient power usage in the portable terminal, efficient power usage is also required in the power amplifier. Therefore, the power amplifier performs a selective operation in a high power mode and in a low power mode.

The above-mentioned power amplifier is supplied with a bias voltage to perform an amplifying operation. In general, because the power amplifier is supplied with the same bias voltage at the time of operations in the high power mode and in the low power mode, there is a problem in that the power may be inefficiently used.

In order to solve the above-mentioned problem, a method of supplying different bias voltages depending on the power mode is needed. In existing methods, depending on the power mode, different bias circuits need to be individually provided, resulting in an increased a circuit area, which consequentially causes a further problem in that the volume of the portable terminal is increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a bias circuit, including: a bias setting unit configured to vary a voltage level of a control signal controlling a bias voltage according to an operation of a first transistor being switched-off in a high power mode and switched-on in a low power mode; and a bias supplying unit including a bias supplying transistor switched based on the control signal, to supply the bias voltage having a voltage level according to a switching operation of the bias supplying transistor.

The bias setting unit may include: a control signal providing unit configured to provide the control signal having a level set according to a voltage level of a reference power; and a control signal varying unit including the first transistor and a first resistor connected to a collector of the first transistor, wherein the first transistor is switched-off in the high power mode to maintain the signal level of the control signal and is switched-on in the low power mode to reduce the signal level of the control signal.

The control signal providing unit may include a second transistor, a third transistor, a second resistor, and a third resistor, the signal level of the control signal is determined according to a sum of a base-emitter voltage of the second transistor and a base-emitter voltage of the third transistor, a resistance value of the second resistor determines a voltage level of the base-emitter voltage of the second transistor, and a resistance value of the third resistor determines a voltage level of the base-emitter voltage of the third transistor.

The control signal providing unit further includes a capacitor stabilizing the reference power, the first transistor may include a base receiving a power mode signal having information regarding the power mode through a fourth resistor, and an emitter connected to a ground, the second transistor may include an emitter connected to the ground through the second resistor, and a base connected to the capacitor to be supplied with the reference power stabilized by the capacitor according to switching-on or switching-off of the third transistor, and the third transistor has an emitter connected to the ground, a collector receiving the reference power through the third resistor, and a base connected to the emitter of the second transistor.

In accordance with an embodiment, there is provided a power amplifier, including: a bias circuit including a bias setting unit varying a voltage level of a control signal controlling a bias voltage based on a first transistor being switched-off in a high power mode and switched-on in a low power mode, and a bias supplying unit including a bias supplying transistor switched according to the control signal from the bias setting unit, and configured to supply the bias voltage having a voltage level according to a switching operation of the bias supplying transistor; and an amplifying unit configured to receive the bias voltage from the bias circuit to amplify a power level of an input signal.

The power amplifier may also include an input matching circuit configured to match impedance of a signal transfer path between an input signal terminal from which the input signal is input, and the amplifying unit.

The power amplifier may also include an output matching circuit configured to match impedance of a signal transfer path between an output signal terminal to which an output signal amplified by the amplifying unit is output, and the amplifying unit.

The bias circuit may reduce a voltage level of the bias voltage at a time of the low power mode to reduce current consumption of the amplifying unit.

The bias setting unit may include: a control signal providing unit configured to provide the control signal having a level set according to a voltage level of received reference power; and a control signal varying unit including the first transistor and a first resistor connected to a collector of the first transistor, the first transistor being switched-off in the high power mode to maintain the signal level of the control signal and being switched-on in the low power mode to reduce the signal level of the control signal.

The control signal providing unit may include a second transistor, a third transistor, a second resistor, and a third resistor, the signal level of the control signal is determined according to a sum of a base-emitter voltage of the second transistor, and a base-emitter voltage of the third transistor, a resistance value of the second resistor determines a voltage level of the base-emitter voltage of the second transistor, and a resistance value of the third resistor determines a voltage level of the base-emitter voltage of the third transistor.

The control signal providing unit further may include a capacitor stabilizing the reference power, the first transistor may include a base receiving a power mode signal having information regarding the power mode through a fourth resistor, and an emitter connected to a ground, the second transistor may include an emitter connected to the ground through the second resistor, and a base connected to the capacitor to be supplied with the reference power stabilized by the capacitor according to switching-on or switching-off of the third transistor, and the third transistor has an emitter connected to the ground, a collector receiving the reference power through the third resistor, and a base connected to the emitter of the second transistor.

In accordance with an embodiment, there is provided a bias circuit, including: a control signal providing unit configured to provide a control signal having a signal level based on a voltage level of reference power; a control signal varying unit configured to vary the signal level of the control signal according to a power mode signal; and a bias supplying unit configured to vary a voltage level of a bias voltage based on the control signal and supply the varied voltage level of the bias voltage, wherein in response to the power mode signal being a high power mode, the control signal varying unit is turned-off and the signal level of the control signal is maintained and applied to the bias supplying unit, and in response to the power mode signal being a low power mode, the control signal varying unit is turned-on to receive and decrease the signal level of the control signal and transmit the control signal, as decreased, to the bias supplying unit.

The reference power may include a preset voltage level according to the high power mode or the low power mode.

The control signal varying unit may include a first transistor, a first resistor, and a fourth resistor, wherein, in response to the first transistor receiving the power mode signal as the high power mode, the first transistor is turned-off to maintain the signal level of the control signal, and the maintained signal level of the control signal is applied to a base of a bias supplying transistor of the bias supplying unit.

The bias supplying unit may include a bias supplying transistor and a resistor, wherein the bias supplying transistor is switched based on the control signal to supply the bias voltage, having the varied voltage level based on a degree of turn-on of the bias supplying transistor, to an amplifying unit.

A base of the first transistor may receive the power mode signal including information regarding the power mode through the fourth resistor, an emitter of the first transistor is connected to a ground, and a collector of the first transistor is connected to a collector of a third transistor of the control signal providing unit through the first resistor.

The control signal providing unit may include second and third transistors, a second resistor, a third resistor, and a capacitor, wherein a collector of the second transistor receives a driving power having a preset voltage level, and an emitter of the second transistor is connected to the ground through the second resistor, and a base of the second transistor receives the reference power, stabilized by the capacitor.

The voltage level of the control signal may be a sum of a collector-base voltage of the third transistor, and a base-emitter voltage of the third transistor.

A collector of the bias supplying transistor may receive a driving power, a base of the bias supplying transistor receives the control signal, and an emitter of the bias supplying transistor provides the bias voltage set by the resistor to the amplifying unit.

The control signal providing unit may be configured to determine a voltage level of the control signal according to resistance values of the second resistor and the third resistor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
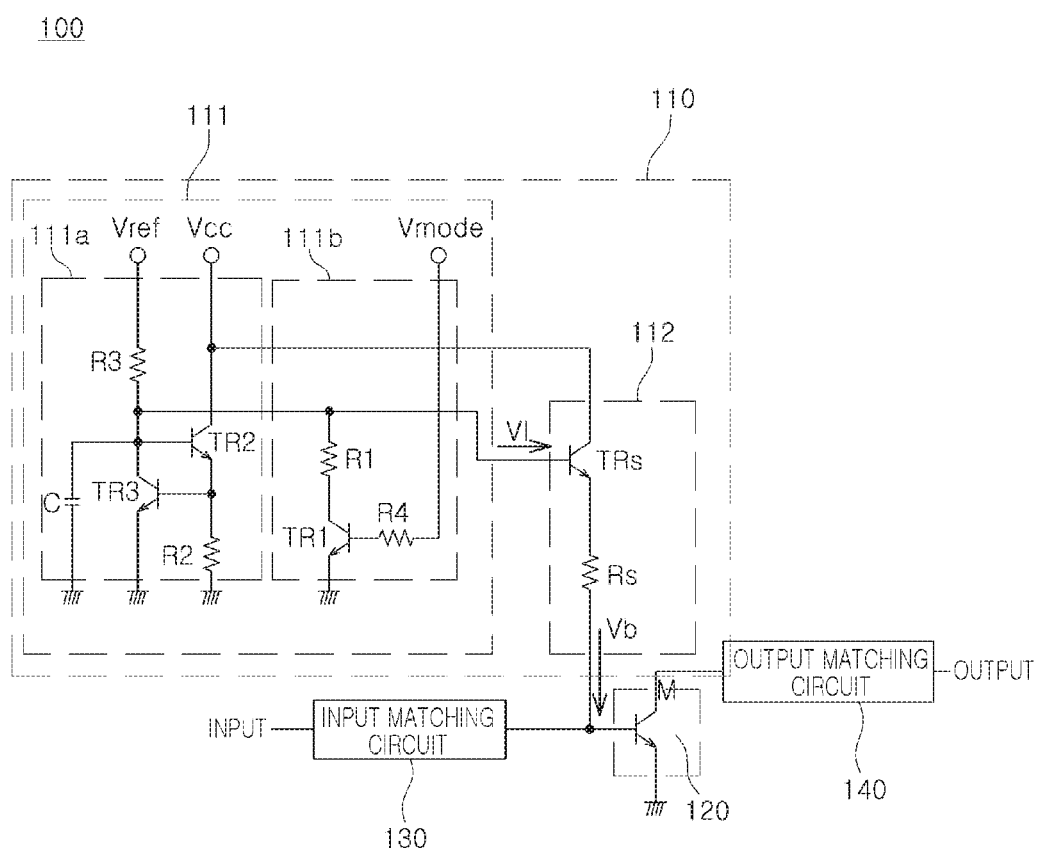
FIG. 1 is a schematic circuit diagram of a power amplifier, according to an embodiment.

FIG. 1 is a schematic circuit diagram of a power amplifier, according to an embodiment.

Referring to FIG. 1, a power amplifier 100, according to an embodiment, includes a bias circuit 110, an amplifying unit 120, an input matching circuit 130, and an output matching circuit 140.

The bias circuit 110 includes a bias setting unit 111 and a bias supplying unit 112. Although the configuration of the bias circuit 110 includes the bias supplying unit 112, a person of ordinary skill in the art will appreciate that the bias supplying unit 112 may be positioned externally of the bias circuit 110. In an alternative configuration, the bias supplying unit 112 may be integral to the bias setting unit 111.

The bias setting unit 111 includes a control signal providing unit 111a and a control signal varying unit 111b.

The control signal providing unit 111a provides a control signal VI having a signal level depending on a voltage level of reference power Vref.

The control signal varying unit 111b varies the signal level of the control signal VI based on a power mode signal Vmode, which includes power mode information. The control signal varying unit 111b transfers the varied signal level of the control signal VI to the bias supplying unit 112.

The bias supplying unit 112 varies a voltage level of a bias voltage Vb based on the control signal VI and supplies the varied voltage level to the amplifying unit 120.

The control signal varying unit 111b includes a first transistor TR1, a first resistor R1, and a fourth resistor R4.

The control signal providing unit 111a includes second and third transistors TR2 and TR3, a second resistor R2, a third resistor R3, and a capacitor C.

The bias supplying unit 112 includes at least one bias supplying transistor TRs and resistor Rs.

The bias setting unit 111 sets the voltage level of the bias voltage by varying the signal level of the control signal VI, which is set, controlled, modified, corrected, regulated, adjusted, or defined based on the reference power Vref having a preset voltage level based on a high power mode or a low power mode. The bias supplying unit 112 includes the bias supplying transistor TRs switched based on the control signal VI from the bias setting unit 111, to supply the bias voltage Vb having the voltage level based on a degree of turn-on of the bias supplying transistor TRs to the amplifying unit 120.

A circuit connection relationship of the bias circuit 110 will be described in more detail.

A base of the first transistor TR1 of the control signal varying unit 111b of the bias setting unit 111 receives the power mode signal Vmode having information regarding the power mode through the fourth resistor R4, an emitter of the first transistor TR1 is connected to a ground, and a collector of the first transistor TR1 is connected to a collector of the third transistor TR3 through the first resistor R1.

A collector of the second transistor TR2 of the control signal providing unit 111a of the bias setting unit 111 receives driving power Vcc having a preset voltage level, and an emitter of the second transistor TR2 is connected to the ground through the second resistor R2. A base of the second transistor TR2 receives the reference power Vref, stabilized by the capacitor C.

The collector of the third transistor TR3 receives the reference power Vref through the third resistor R3, an emitter of the third transistor TR3 is connected to the ground, and a base of the third transistor TR3 is connected to the emitter of the second transistor TR2.

A collector of the bias supplying transistor TRs of the bias supplying unit 112 receives the driving power Vcc, a base of the bias supplying transistor TRs receives the control signal VI, and an emitter of the bias supplying transistor TRs provides the bias voltage set by the resistor Rs to the amplifying unit 120.

The amplifying unit 120 includes an amplifying transistor M, a base of the amplifying transistor M is input with an input signal to be amplified and is supplied with the bias voltage Vb from the bias supplying unit 112. An emitter of the amplifying transistor M is connected to the ground, and a collector of the amplifying transistor M is output an amplified signal.

The input matching circuit 130 matching impedance of a signal transfer path is provided at an input signal terminal of the amplifying transistor M; that is, the base of the amplifying transistor M from which an input signal of the amplifying transistor M is input. The output matching circuit 140 matching impedance of a signal transfer path is provided at an output signal terminal of the amplifying transistor M; that is, the collector of the amplifying transistor M to which an output signal of the amplifying transistor M is output.

An operation of the bias circuit 110 will be described in detail with reference to FIG. 1.

The power mode signal Vmode setting the power mode of the power amplifier 100 is input to the bias setting unit 111. The power mode signal Vmode represents the high power mode or the low power mode. For example, in the case of the high power mode, the power mode signal Vmode is a low level signal, and in the case of the low power mode, the power mode signal Vmode is a high level signal. The high power mode is a mode amplifying a power level of the input signal to be high, and the low power mode is a mode amplifying the power level of the input signal to be low.

The control signal providing unit 111a of the bias setting unit 111 determines a voltage level of the control signal VI based on resistance values of the second resistor R2 and the third resistor R3.

In one embodiment, the voltage level of the control signal VI is a sum of a collector-base voltage of the third transistor TR3, and a base-emitter voltage of the third transistor TR3.

A base-emitter voltage of the second transistor TR2 is a voltage equal to the collector-base voltage of the third transistor TR3.

As a result, the voltage level of the control signal VI is a sum of the base-emitter voltage of the second transistor TR2 and the base-emitter voltage of the third transistor TR3.

A voltage level of the base-emitter voltage of the second transistor TR2 is determined based on a resistance value of the second resistor R2, and a voltage level of the base-emitter voltage of the third transistor TR3 is determined based on a resistance value of the third resistor R3.

The control signal varying unit 111b varies the signal level of the control signal VI from the control signal providing unit 111a based on the power mode signal Vmode and transfers the varied signal level to the bias supplying unit 112.

In one example in which the power mode signal Vmode representing the high power mode is input to the base of the first transistor TR1, the first transistor TR1 is turned-off, such that the signal level of the control signal VI from the control signal providing unit 111a is maintained and applied to the base of the bias supplying transistor TRs. That is, the control signal providing unit 111a transmits the signal level of the control signal VI to the bias supplying unit 112. In one configuration, the transmission of the control signal VI to the bias supplying unit 112 is a direct transmission. In another configuration, the transmission of the control signal VI to the bias supplying unit 112 is through other structural elements (not shown), excluding the control signal varying unit 111b. As a result, the bias voltage Vb is applied to the base of the amplifying transistor M of the amplifying unit 120.

In another example, in a case in which the power mode signal Vmode representing the low power mode is input to the base of the first transistor TR1, the first transistor TR1 is turned-on, such that the signal level of the control signal VI from the control signal providing unit 111a is decreased. As a result, the signal level of the control signal VI applied to the base of the bias supplying transistor TRs is lower than that of the high power mode, and a low voltage level of a bias voltage is applied to the amplifying transistor M.

Figure 2:
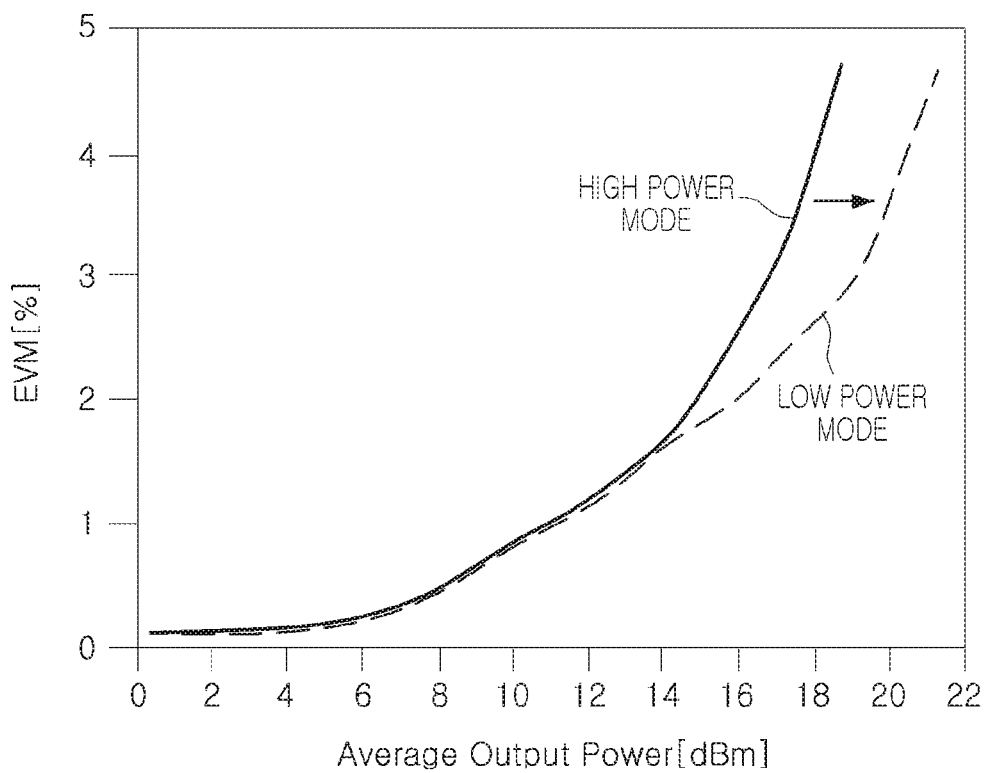
FIG. 2 is an error vector magnitude (EVM) graph of the power amplifier, according to an embodiment.

FIG. 2 is an error vector magnitude (EVM) graph of the power amplifier, according to an embodiment.

Referring to FIG. 2, because the power amplifier, according to an embodiment, is operated in the high power mode or the low power mode, the power amplifier driven at the low power mode consumes less power compared to a case in which the power amplifier is driven in a single mode.

From the error vector magnitude (EVM) graph, a linearity index illustrated in FIG. 2, linearity up to a greater power is secured at the time of the high power mode.

If output power does not need to be large power of 14 dBm or more, linearity performance is satisfied at 14 dBm or less even though the power amplifier is operated at the low power mode.

Figure 3:
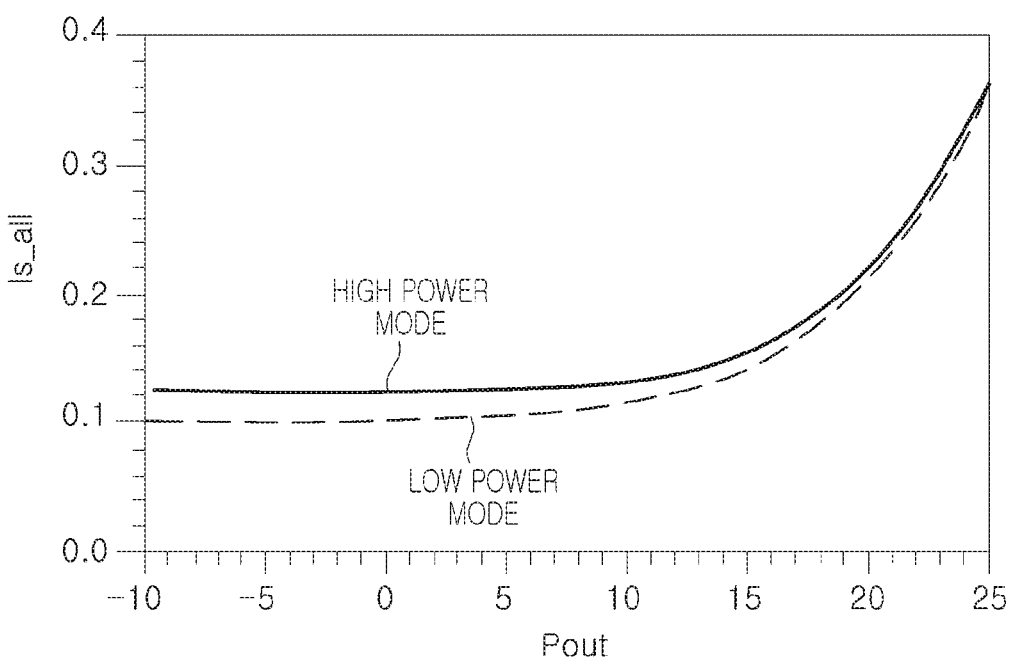
FIG. 3 is a current consumption graph of the power amplifier, according to an embodiment.

FIG. 3 is a current consumption graph of the power amplifier, according to an embodiment.

As shown in FIG. 3, using the configuration of the bias circuit 110, as previously described with reference to FIG. 1, current consumption in the low power mode is lower than that of the high power mode.

Figure 4A:
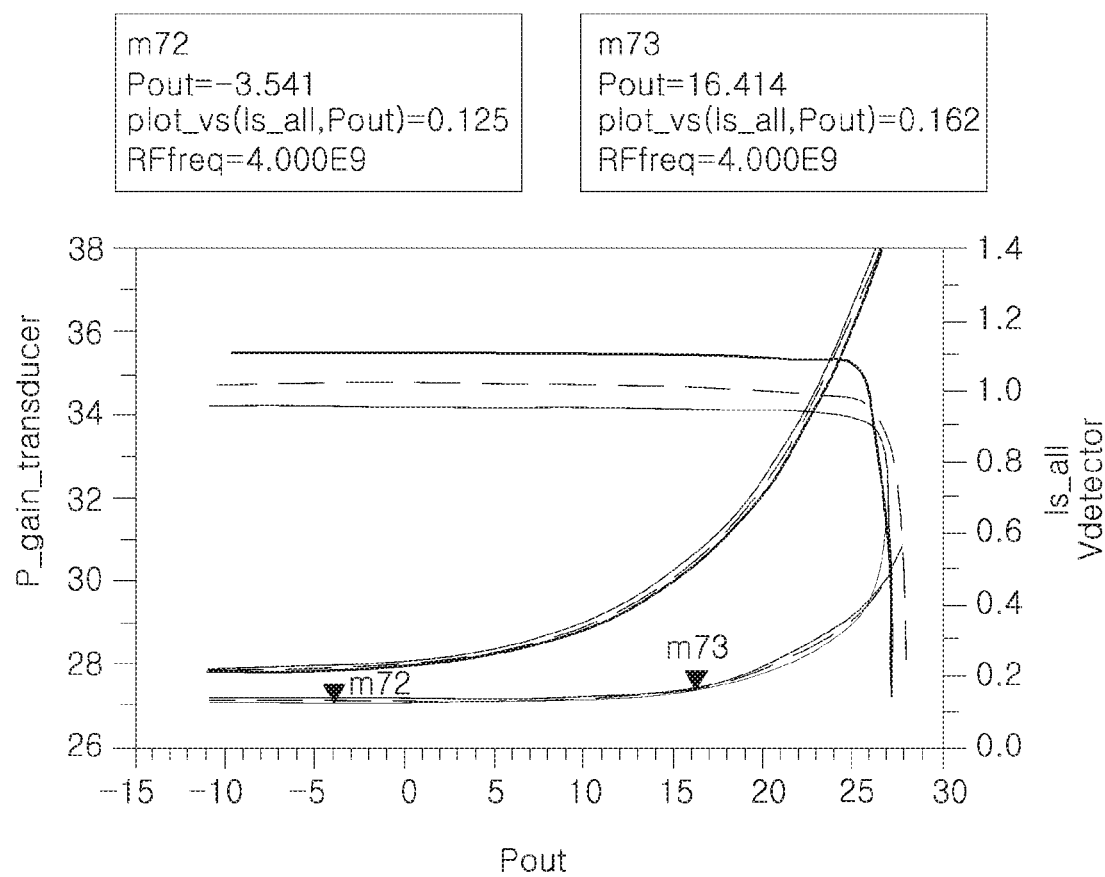
FIGS. 4A and 4B are current consumption graphs based on a collector connection of a first transistor of the power amplifier, according to an embodiment.
Figure 4B:
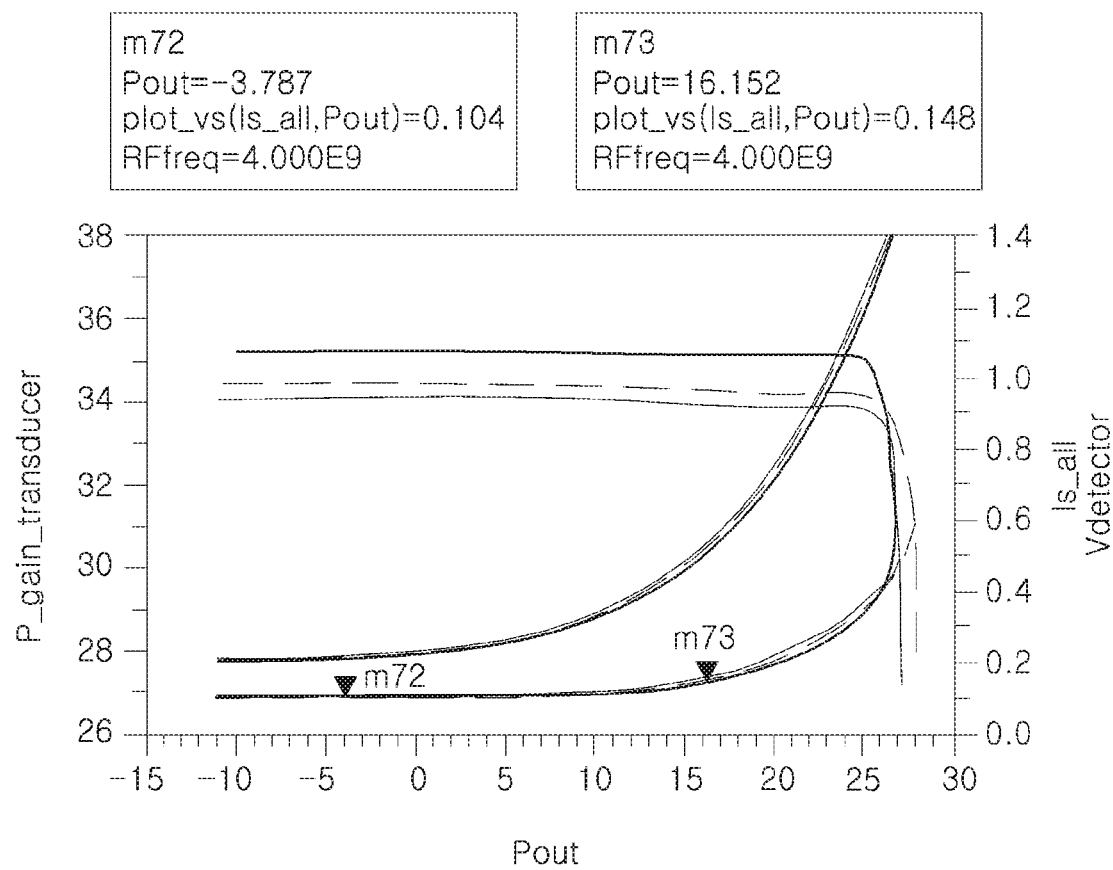

FIGS. 4A and 4B are current consumption graphs based on a collector connection of the first transistor of the power amplifier, according to an embodiment.

Referring to FIGS. 1 and 4B, the collector of the first transistor TR1 is connected to the collector of the third transistor TR3 through the second resistor R2. Therefore, in one illustrative configuration, the bias circuit 110 has a lower current consumption than that of a case in which the collector of the first transistor TR1 of the control signal varying unit 111b is connected to the emitter of the second transistor TR2 of the control signal providing unit 111a, through the second resistor R2 of the control signal varying unit 111b.

That is, FIG. 4B illustrates current consumption of the power amplifier 100 in a case in which the collector of the first transistor TR1 is connected to the collector of the third transistor TR3, through the second resistor R2, to maintain or reduce the signal level of the control signal based on the power mode. Furthermore, FIG. 4B illustrates current consumption of the power amplifier 100 in a case in which the collector of the first transistor TR1 is connected to the emitter of the second transistor TR2, through the second resistor R2.

As illustrated in FIG. 4B, in a case in which resistance values of the first to fourth resistors R1, R2, R3, and R4 of FIG. 4A and resistance values of the first to fourth resistors R1, R2, R3, and R4 of FIG. 4B are maintained to be equal to each other, current consumption factors of 0.104 at the low power mode and 0.148 at the high power mode are recorded. In contrast, as illustrated in FIG. 4A, current consumption factors of 0.125 at the low power mode and 0.162 at the high power mode are recorded in a case of equal outputs.

To reduce the current consumption in the case of FIG. 4A to the case as shown in FIG. 4B, the resistance value of the second resistor R2 or the third resistor R3 needs to be increased twice or more compared to the case of FIG. 4B, which may cause an increase in a volume of a resistance element. As a result, in a case in which the power amplifier or the bias circuit is formed by a single integrated circuit (IC), a circuit layout may not be optimal.

As described above, the bias circuit and the power amplifier, according to an embodiment, supplies the bias voltage having different voltage levels according to the mode setting of the high power mode and the low power mode to the amplifying unit. The bias circuit and the power amplifier are also configured as a simple circuit capable of bias supplying the bias voltage through one bias supplying transistor, according to the power mode setting and supplying the bias voltage with different voltage levels, depending on a mode. As a result, in accord with some of the many advantages associated with some or all of the embodiments described above, power usage efficiency is increased and manufacturing costs are reduced.

Further, because the collector of the first transistor of the bias setting unit receives the reference power through the second resistor, the current consumption is further reduced. Because the resistance values of the third and fourth resistors are set to be low, the layout is optimized in the case in which the bias circuit or the power amplifier is configured using a single integrated circuit.

As set forth above, in accord with some of the many advantages associated with some or all of the embodiments described, because different bias voltages are provided depending on the power mode through a simple circuit, manufacturing costs are inexpensive, power consumption at the low power mode is reduced, and power usage efficiency is increased.

The apparatuses, units, circuits, and other components illustrated in FIG. 1 that performs the operations described herein are implemented by hardware components. Examples of hardware components include capacitor, resistors, switches, transistors, controllers, sensors, generators, drivers, and any other electronic components known to one of ordinary skill in the art.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit, comprising:
a bias setting unit configured to vary a voltage level of a control signal in response to a selected power mode signal, and comprising a first transistor configured to receive the selected power mode signal, wherein a signal level of the control signal is determined based on a sum of a base-emitter voltage of a second transistor and a base-emitter voltage of a third transistor; and
a bias supplying unit configured to supply a bias voltage having a voltage level determined based on the voltage level of the control signal, and comprising a bias supplying transistor,
wherein the first transistor is directly connected to the bias supplying transistor through a first resistor.

2. The bias circuit of claim 1, wherein the bias setting unit varies the voltage level of the control signal in response to an operation of the first transistor switched-off in a high power mode of the selected power mode signal and switched-on in a low power mode of the selected power mode signal.

3. The bias circuit of claim 2, wherein the bias supplying unit comprises an impedance between the bias supplying transistor and a bias node,
wherein the bias supplying transistor sets a bias voltage at the bias node in the low power mode and the high power mode based on the control signal.

4. The bias circuit of claim 3, wherein the bias setting unit comprises:
a control signal providing unit configured to provide the control signal having a level set according to a voltage level of a reference power; and
a control signal varying unit comprising the first transistor and the first resistor connected to a collector of the first transistor, wherein the first transistor is switched-off in the high power mode to maintain the signal level of the control signal and is switched-on in the low power mode to reduce the signal level of the control signal.

5. A bias circuit, comprising:
a bias setting unit configured to vary a voltage level of a control signal in response to a selected power mode signal, and comprising a first transistor configured to receive the selected power mode signal; and
a bias supplying unit configured to supply a bias voltage having a voltage level determined based on the voltage level of the control signal, and comprising a bias supplying transistor,
wherein the first transistor is directly connected to the bias supplying transistor through a first resistor,
wherein the bias setting unit varies the voltage level of the control signal in response to an operation of the first transistor switched-off in a high power mode of the selected power mode signal and switched-on in a low power mode of the selected power mode signal,
wherein the bias supplying unit comprises an impedance between the bias supplying transistor and a bias node,
wherein the bias supplying transistor sets a bias voltage at the bias node in the low power mode and the high power mode based on the control signal,
wherein the bias setting unit comprises:
a control signal providing unit configured to provide the control signal having a level set according to a voltage level of a reference power; and
a control signal varying unit comprising the first transistor and the first resistor connected to a collector of the first transistor,
wherein the first transistor is switched-off in the high power mode to maintain the signal level of the control signal and is switched-on in the low power mode to reduce the signal level of the control signal, and
wherein the control signal providing unit comprises a second transistor, a third transistor, a second resistor, and a third resistor,
the signal level of the control signal is determined according to a sum of a base-emitter voltage of the second transistor and a base-emitter voltage of the third transistor,
a resistance value of the second resistor determines a voltage level of the base-emitter voltage of the second transistor, and
a resistance value of the third resistor determines a voltage level of the base-emitter voltage of the third transistor.

6. The bias circuit of claim 5, wherein the control signal providing unit further includes a capacitor stabilizing the reference power,
the first transistor comprises a base receiving the selected power mode signal having information regarding the power mode through a fourth resistor, and an emitter connected to a ground,
the second transistor comprises an emitter connected to the ground through the second resistor, and a base connected to the capacitor to be supplied with the reference power stabilized by the capacitor according to switching-on or switching-off of the third transistor, and
the third transistor has an emitter connected to the ground, a collector receiving the reference power through the third resistor, and a base connected to the emitter of the second transistor.

7. A power amplifier, comprising:
a bias circuit comprising
a bias setting unit configured to vary a voltage level of a control signal based on a selected power mode signal, and comprising a first transistor configured to receive the selected power mode signal, and
a bias supplying unit configured to supply a bias voltage having a voltage level determined based on the voltage level of the control signal, and comprising a bias supplying transistor; and
an amplifying unit configured to receive the bias voltage from the bias circuit to amplify a power level of an input signal,
wherein the first transistor is directly connected to the bias supplying transistor through a first resistor, and a signal level of the control signal is determined based on a sum of a base-emitter voltage of a second transistor and a base-emitter voltage of a third transistor.

8. The bias circuit of claim 7, wherein the bias setting unit varies the voltage level of the control signal in response to an operation of the first transistor switched-off in a high power mode of the selected power mode signal and switched-on in a low power mode of the selected power mode signal.

9. The bias circuit of claim 8, wherein the bias supplying unit comprises an impedance between the bias supplying transistor and a bias node,
wherein the bias supplying transistor sets a bias voltage at the bias node in the low power mode and the high power mode based on the control signal.

10. The power amplifier of claim 9, further comprising:
an input matching circuit configured to match impedance of a signal transfer path between an input signal terminal from which the input signal is input, and the amplifying unit, and
an output matching circuit configured to match impedance of a signal transfer path between an output signal terminal to which an output signal amplified by the amplifying unit is output, and the amplifying unit.

11. The power amplifier of claim 9, wherein the bias circuit reduces a voltage level of the bias voltage at a time of the low power mode to reduce current consumption of the amplifying unit.

12. The power amplifier of claim 9, wherein the bias setting unit includes:
a control signal providing unit configured to provide the control signal having a level set according to a voltage level of received reference power; and
a control signal varying unit comprising the first transistor and the first resistor connected to a collector of the first transistor, the first transistor being switched-off in the high power mode to maintain the signal level of the control signal and being switched-on in the low power mode to reduce the signal level of the control signal.

13. The power amplifier of claim 12, wherein the control signal providing unit comprises the second transistor, the third transistor, a second resistor, and a third resistor,
a resistance value of the second resistor determines a voltage level of the base-emitter voltage of the second transistor, and
a resistance value of the third resistor determines a voltage level of the base-emitter voltage of the third transistor.

14. The power amplifier of claim 13, wherein the control signal providing unit further comprises a capacitor stabilizing the reference power,
the first transistor comprises a base receiving the selected power mode signal having information regarding the power mode through a fourth resistor, and an emitter connected to a ground,
the second transistor comprises an emitter connected to the ground through the second resistor, and a base connected to the capacitor to be supplied with the reference power stabilized by the capacitor according to switching-on or switching-off of the third transistor, and
the third transistor has an emitter connected to the ground, a collector receiving the reference power through the third resistor, and a base connected to the emitter of the second transistor.

\* \* \* \* \*